US006826077B2

(12) United States Patent
Smith et al.

(10) Patent No.: US 6,826,077 B2
(45) Date of Patent: Nov. 30, 2004

(54) MAGNETIC RANDOM ACCESS MEMORY WITH REDUCED PARASITIC CURRENTS

(75) Inventors: Kenneth K. Smith, Boise, ID (US); Andrew VanBrocklin, Corvallis, OR (US); Peter J. Fricke, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 43 days.

(21) Appl. No.: 10/146,201

(22) Filed: May 15, 2002

(65) Prior Publication Data

US 2003/0214837 A1 Nov. 20, 2003

(51) Int. Cl.[7] .............................................. G11C 11/00
(52) U.S. Cl. ........................ 365/158; 365/171; 365/173
(58) Field of Search ................................ 365/173, 158, 365/171, 97

(56) References Cited

U.S. PATENT DOCUMENTS

| | | | | |
|---|---|---|---|---|
| 5,640,343 A | * | 6/1997 | Gallagher et al. | ........... 365/171 |
| 5,930,164 A | * | 7/1999 | Zhu | ............................. 365/158 |
| 6,269,018 B1 | * | 7/2001 | Monsma et al. | ............ 365/145 |
| 6,292,389 B1 | * | 9/2001 | Chen et al. | ................... 365/158 |
| 6,331,944 B1 | * | 12/2001 | Monsma et al. | ............ 365/171 |
| 6,456,525 B1 | * | 9/2002 | Perner et al. | ................ 365/171 |
| 6,469,926 B1 | * | 10/2002 | Chen | .......................... 365/158 |
| 6,473,337 B1 | * | 10/2002 | Tran et al. | ................... 365/173 |
| 6,531,723 B1 | * | 3/2003 | Engel et al. | ................. 257/200 |
| 6,532,164 B2 | * | 3/2003 | Redon et al. | .................. 365/97 |
| 6,545,906 B1 | * | 4/2003 | Savtchenko et al. | ........ 365/158 |

* cited by examiner

Primary Examiner—Richard Elms
Assistant Examiner—Hien Nguyen

(57) ABSTRACT

Systems and methods for storing data are provided. A representative system for storing data includes a magnetic random access memory (MRAM) device having a plurality of memory cells. Each memory cell includes a magnetic tunnel junction and a non-magnetic tunnel junction that are connected in series. The magnetic tunnel junction stores a bit value corresponding to a logic high (1) or a logic low (0). The non-magnetic tunnel junction provides little resistance when the memory cell is being read, and a substantially high resistance when the memory cell is not being read. As a result, a negligible level of parasitic current leaks through memory cells that are not being read.

32 Claims, 7 Drawing Sheets

US 6,826,077 B2

MAGNETIC RANDOM ACCESS MEMORY WITH REDUCED PARASITIC CURRENTS

FIELD OF THE INVENTION

The invention relates to data storage devices. More specifically, the invention relates to magnetic random access memory (MRAM) with reduced parasitic currents.

DESCRIPTION OF THE RELATED ART

Magnetic random access memory (MRAM) is a non-volatile memory that is being considered for long term data storage. Performing read and write operations in MRAM devices would be orders of magnitude faster than performing read and write operations in conventional long term storage devices such as hard drives. In addition, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line. The memory cell stores a bit of information as an orientation of a magnetization. The magnetization of each memory cell assumes one of two stable orientations at any given time. These two stable orientations, parallel and anti-parallel, represent logic values of '0' and '1.'

The magnetization orientation affects the resistance of a memory cell such as a spin dependent tunneling junction device. For instance, resistance of a memory cell is a first value R if the magnetization orientation is parallel, and the resistance of the memory cell is increased to a second value $R+\Delta R$ if the magnetization orientation is changed from parallel to anti-parallel. The magnetization orientation of a selected memory cell and, therefore, the logic state of the memory cell may be read by sensing the resistance state of the selected memory cell.

Sensing the resistance state of a single memory cell in the array can be unreliable. All memory cells in the array are coupled together through many parallel paths. The resistance seen at one cross point equals the resistance of the memory cell at that cross point in parallel with resistances of memory cells in the other rows and columns (the array of memory cells may be characterized as a cross point resistor network).

Moreover, if the memory cell being sensed has a different resistance state due to the stored magnetization, a small differential voltage may develop. This small differential voltage can give rise to parasitic or "sneak path" currents. The parasitic currents can interfere with the sensing of the resistance states. Therefore, there is a need for systems and methods that address these and/or other problems associated with MRAM devices of the prior art.

SUMMARY OF THE INVENTION

The present invention provides systems and methods for storing data. In one embodiment of the invention, a magnetic random access memory (MRAM) cell includes a magnetic tunnel junction and a non-magnetic tunnel junction (NMTJ). In another embodiment, an MRAM device includes a first wire for carrying a current for reading a bit value stored in an MRAM cell, a second wire for carrying a current for reading a bit value stored in the MRAM cell, a first magnetic layer located between the first wire and the second wire, a second magnetic layer located between the first wire and the second wire, a first insulating layer that is located between the first magnetic layer and the second magnetic layer, and a second insulating layer that is located between the second magnetic layer and the second wire.

In yet another embodiment, a method for reading a value stored in a magnetic random access memory (MRAM) cell includes providing a voltage differential across a magnetic tunnel junction of the memory cell and providing a voltage differential across a non-magnetic tunnel junction (NMTJ) of the memory cell.

BRIEF DESCRIPTION OF THE DRAWINGS

The invention can be better understood with reference to the following drawings. The components in the drawings are not necessarily to scale, emphasis instead being placed upon clearly illustrating the principles of the invention. Moreover, in the drawings, like reference numerals designate corresponding parts throughout the several views.

DETAILED DESCRIPTION

As will be described in greater detail herein, systems and methods of the invention can reduce the levels of power consumption and parasitic currents in MRAM devices. Preferably, this is accomplished by including a non-magnetic tunnel junction in an MRAM memory cell. In one embodiment, the non-magnetic tunnel junction includes two conductive layers and an insulating layer positioned between them.

Figure 1:
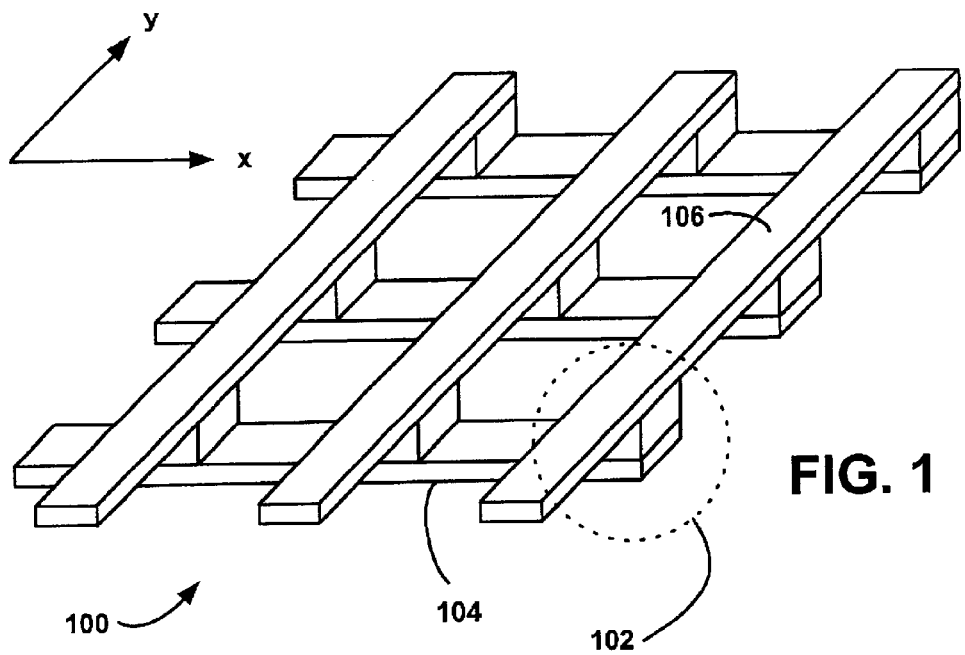
FIG. 1 depicts an example of an MRAM array in accordance with one embodiment of the invention.

Reference is now made to FIG. 1, which illustrates an array 100 of MRAM cells 102. The MRAM cells 102 are arranged in rows and columns, with the rows extending along an x-direction and the columns extending along a y-direction. Only a relatively small number of MRAM cells 102 are shown to simplify the description of the invention. In practice, arrays of any size may be used.

Figure 2A:
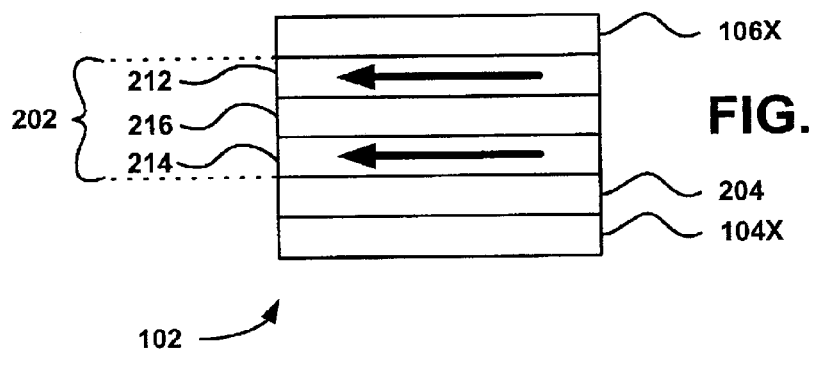
FIGS. 2A and 2B are block diagrams depicting orientations of magnetization for magnetic layers of a memory cell shown in FIG. 1.
Figure 2B:
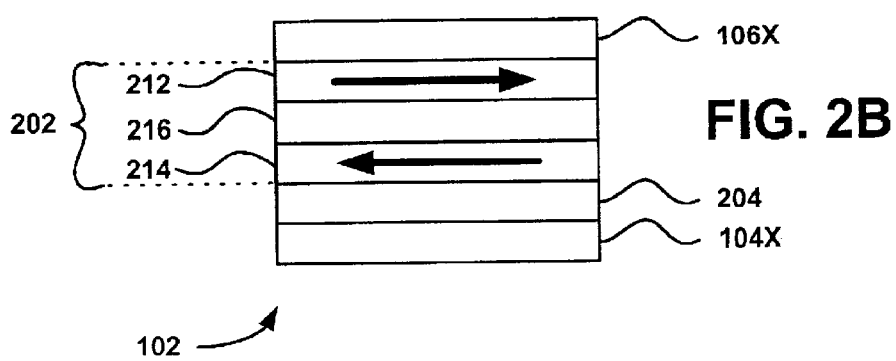

Traces functioning as word lines 104 extend along the x-direction in a plane on one side of the MRAM cell array 100. Traces functioning as bit lines 106 extend along the y-direction in a plane on an opposite side of the MRAM cell array 100. In an alternative embodiment, the word lines 104 may be non-perpendicular to the bit lines 106. Each word line 104 or bit line 106 may be used to conduct write and/or read currents, depending on the particular implementation. There may be one or more word lines 104 for each row of the array 100 and one or more bit lines 106 for each column of the array 100. Each MRAM cell 102 is located at a cross point of a corresponding word line 104 and bit line 106. Referring now to FIGS. 2A and 2B, an MRAM cell 102 includes a magnetic tunnel junction (MTJ) 202, a non-magnetic tunnel junction (NMTJ) 204, a portion 104X of a word line 104, and a portion 106X of a bit line 106. In general, a tunnel junction typically comprises two conducting layers with a thin layer of insulating dielectric between them. Placing an electrical potential across the conducting layers causes electrons to tunnel through the dielectric layer. A magnetic tunnel junction is a tunnel junction whose resistance is a function of the orientation of magnetization of one or more of its conducting layers. A non-magnetic tunnel junction is a tunnel junction whose resistance is not significantly affected by the orientation of magnetization of any of its conducting layers.

The NMTJ 204 significantly reduces the flow of parasitic currents across the MTJ 202. The portions 104X and 106X are located at a cross point of a corresponding word line 104 and a corresponding bit line 106. Note that the relative positions of the portions 104X and 106X may be interchanged, depending on the desired implementation. The MTJ 202 includes a fixed magnetic layer 214 having a magnetization that is oriented in the plane of the fixed layer 214 but that is fixed so as not to rotate in the presence of an applied magnetic field in a range of interest. The MTJ 202 also includes a "free" layer 212 having a magnetization orientation that is not fixed. Rather, the magnetization can be oriented in either of two directions along an axis (the "easy" axis) lying in the plane of the free layer 212. If the orientations of magnetization of the free layer 212 and of the fixed layer 214 are in the same direction, then the orientations are said to be "parallel" (as indicated by the arrows in FIG. 2A). If the orientations of magnetization of the free layer 212 and of the fixed layer 214 are in opposite directions, then the orientations are said to be "anti-parallel" (as indicated by the arrows in FIG. 2B). The magnetization in the free layer 212 may be oriented by applying write currents to the word line 104 and the bit line 106 that cross the MRAM cell 102. Each magnetic layer 212 or 214 comprises a material that is capable of being well magnetized such as, for example, among others, nickel, iron, and cobalt, or a combination thereof.

The free layer 212 and the fixed layer 214 are separated by an insulating tunnel barrier 216 that comprises a suitable insulating material such as, for example, aluminum oxide, among others. Although the free layer 212 and the fixed layer 214 are shown as being respectively above and below the insulating tunnel barrier 216, their relative positions may be interchanged, as will be understood by those skilled in the art. The insulating tunnel barrier 216 allows quantum mechanical tunneling to occur between the free layer 212 and the fixed layer 214. This tunneling phenomenon is electron spin dependent, making the resistance of the memory cell 102 a function of the relative orientations of magnetization of the free layer 212 and of the fixed layer 214. For instance, resistance of the memory cell 102 is a first value R if the orientations of magnetization of the free layer 212 and of the fixed layer 214 are parallel and a second value R+ΔR if the orientations are anti-parallel.

Figure 3A:
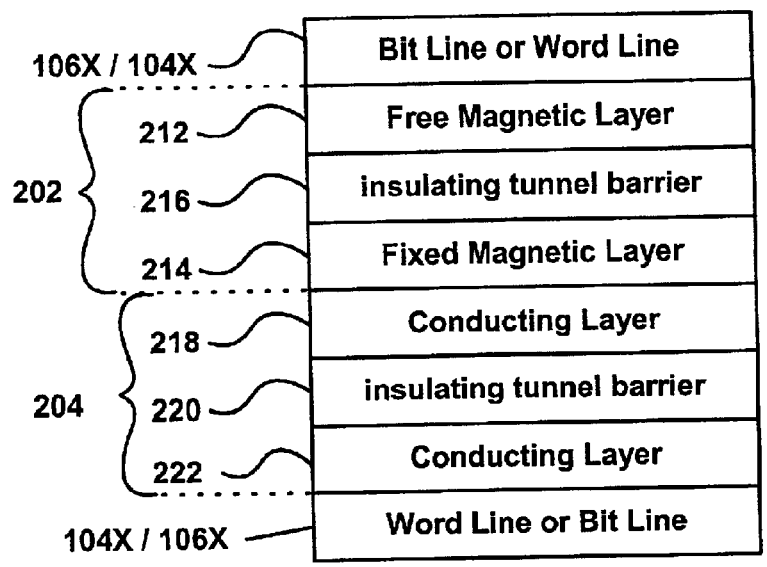
FIGS. 3A–3D are block diagrams depicting embodiments of a memory cell shown in FIG. 1.

FIG. 3A depicts a first embodiment of a memory cell 102. The memory cell 102 includes a magnetic tunnel junction (MTJ) 202 and an NMTJ 204. The NMTJ 204 reduces the level of parasitic currents that flow through the memory cell 102 while an adjacent memory cell is being read. The NMTJ 204 may be positioned either below the MTJ 202, as shown in FIG. 3A, or above it, as will be understood by those skilled in the art. In another embodiment, a first NMTJ 204 may be located below the MTJ 202, and a second NMTJ 204 may be located above the MTJ 202.

The NMTJ 204 includes conducting layers 218 and 222, and an insulating tunnel barrier 220. The conducting layers 218 and 222 may each comprise any highly conductive material such as, for example, copper or aluminum, among others. The insulating tunnel barrier 220 comprises a suitable insulating material and is thin enough to allow tunneling of electrons between the conducting layers 218 and 222. For example, the insulating tunnel barrier 220 may comprise aluminum oxide and may be between 5 and 20 angstroms thick.

Figure 3B:
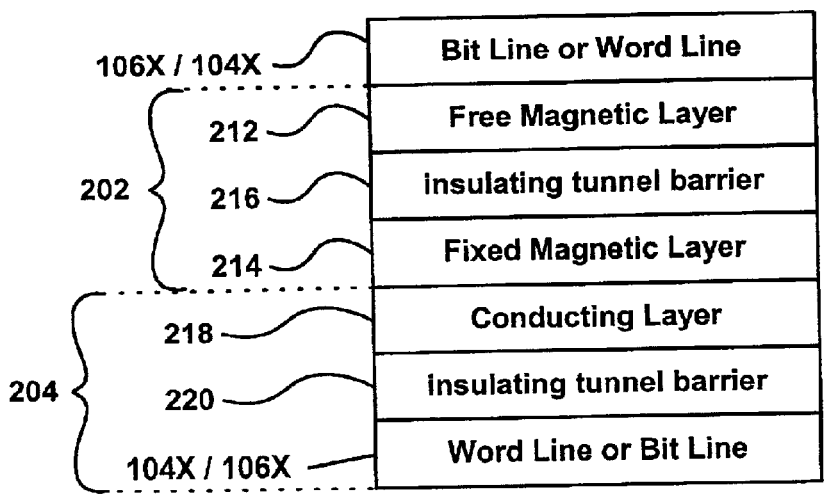

FIG. 3B depicts a second embodiment of a memory cell 102. In this embodiment, the NMTJ 204 of the memory cell 102 includes a conducting layer 218 and an insulating tunnel barrier 220. The NMTJ 204 also comprises a portion 104X of a word line 104 (FIG. 1) or a portion 106X of a bit line 106 (FIG. 1), depending on whether the NMTJ 204 is in contact with a word line 104 or a bit line 106.

Figure 3C:
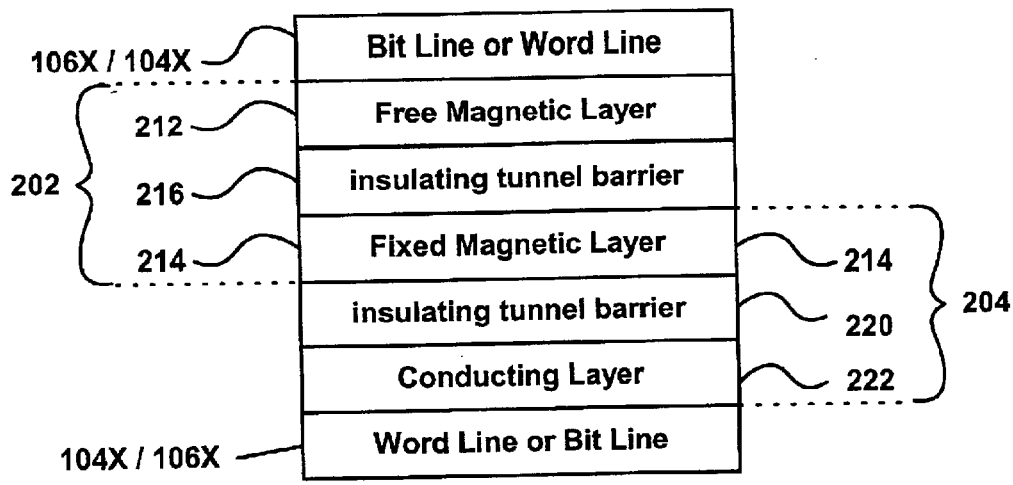

FIG. 3C depicts a third embodiment of a memory cell 102. In this embodiment, the memory cell includes an MTJ 202 and an NMTJ 204 that comprise a shared fixed magnetic layer 214. In another possible implementation, the MTJ 202 and the NMTJ 204 may comprise a shared free magnetic layer 212, depending on the relative positions of the MTJ 202 and the NMTJ 204. Although the NMTJ 204 may include a magnetized layer, the resistance of the NMTJ 204 is independent of the orientation of magnetization of such magnetized layer.

Figure 3D:
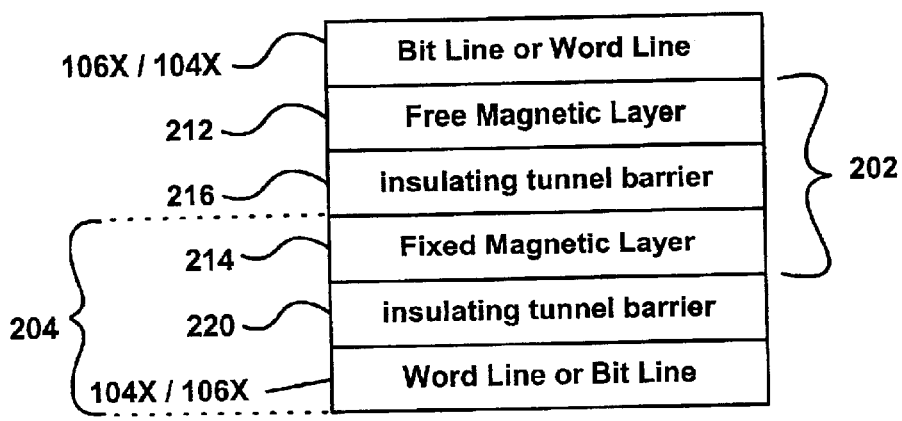

FIG. 3D depicts a fourth embodiment of a memory cell 102. In this embodiment, the memory cell includes an MTJ 202 and an insulating tunnel barrier 220. The insulating tunnel barrier 220 is part of an NMTJ 204. In addition to comprising the insulating tunnel barrier, the NMTJ 204 comprises a portion 104X of a word line 104 or a portion 106X of a bit line 106, depending on whether the NMTJ 204 is in contact with a word line 104 or a bit line 106. Furthermore, the NMTJ 204 shares a magnetic layer with the MTJ 202. The shared magnetic layer may be the fixed magnetic layer 214, as shown in FIG. 3D, or may be the free magnetic layer 212, depending on the relative position of the MTJ 202 and the NMTJ 204.

Figure 4:
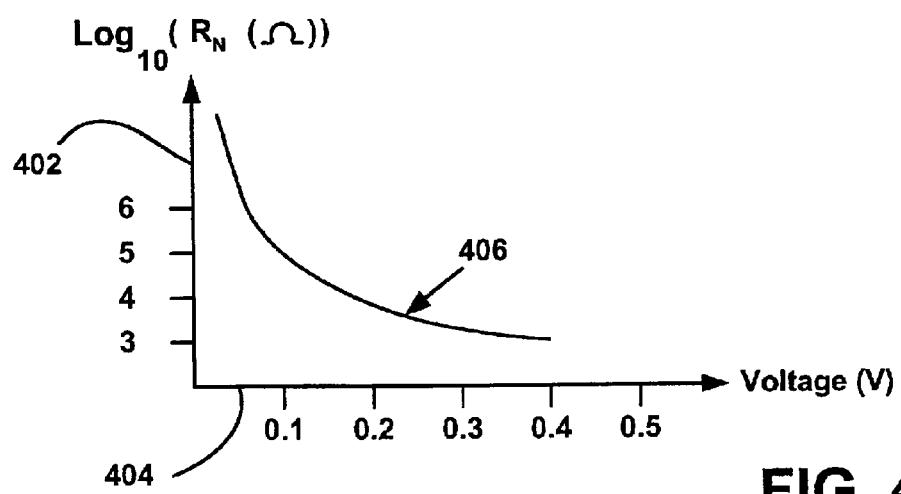
FIG. 4 is a graph depicting an example of variations in resistance across the non-magnetic tunnel junction depicted in FIG. 3 in response to changes in voltage.

FIG. 4 is a graph depicting variations in resistance across an NMTJ in response to changes in the voltage across the NMTJ. The vertical axis 402 represents values equal to $\log_{10} R_N$, where $R_N$ is the resistance in ohms across the NMTJ. The horizontal axis 404 represents the voltage in Volts across the NMTJ. The line segment 406 represents a plot of $\log_{10} R_N$ over a certain voltage range. As suggested by FIG. 4, the NMTJ provides a resistance that has a negative exponential correlation with the voltage across the NMTJ. For example, if the voltage doubles from 0.1 Volts to 0.2 Volts, then $R_N$ decreases ten-fold from 100 Kilo Ohms to 10 Kilo Ohms. Similarly, if the voltage doubles from 0.2 Volts to 0.4 Volts, then $R_N$ decreases ten-fold from 10 Kilo Ohms to only 1 Kilo Ohms. Therefore, at lower voltage values when a memory cell 102 is not being read, $R_N$ is very high, where as at higher voltage values when the memory cell 102 is being read, $R_N$ is very low.

In one embodiment, the total resistance ($R_T$) of a memory cell is equal to $R_N + R_M$, where $R_M$ represents the resistance of the MTJ of the memory cell. When the memory cell is not being read but still has a small voltage drop across it, $R_N$ will be relatively high. Therefore $R_T$, which includes $R_N$, will also be relatively high. As a result, only a negligible amount of current (known as parasitic current) is able to pass through the memory cell. The magnitude of the parasitic current ($I_P$) is equal to the voltage drop across the memory cell ($V_C$) divided by $R_T$. In the absence of an NMTJ, the resistance of the memory cell would be much lower and, consequently, $I_P$ would be much higher.

The reduction in parasitic currents that is attributable to the NMTJ reduces the likelihood of a data read error and reduces the amount of power consumed in reading data from the MRAM array 100 (FIG. 1). The reduction in parasitic currents also reduces the memory access time and signal settling time thereby further improving the performance of the MRAM array 100. Note that the graph depicted in FIG. 4 is merely illustrative. Therefore, the exact relationship between the resistance and the voltage across an NMTJ may be different than that illustrated in FIG. 4, depending on the composition and configuration of the NMTJ. For example, in one embodiment, there may be a greater negative exponential correlation between the resistance and the voltage across an NMTJ.

Figure 5:
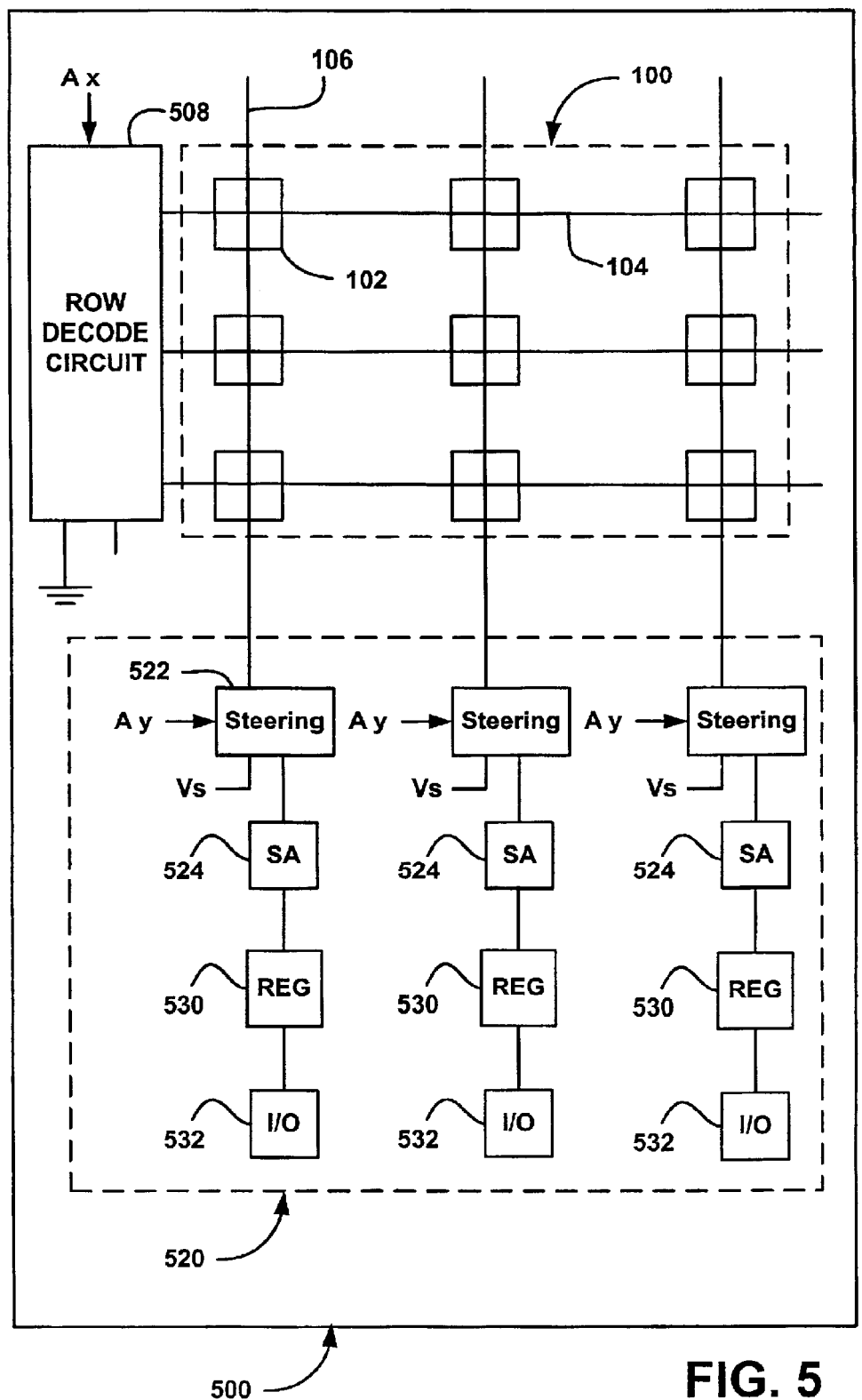
FIG. 5 is a block diagram depicting an MRAM device in accordance with one embodiment.

FIG. 5 is a block diagram depicting an MRAM device 500 that includes memory cells 102 having NMTJs. During read operations, a row decode circuit 508 may apply either a constant supply voltage Vs or a ground potential to the word lines 104. The constant supply voltage Vs may be provided by an external circuit.

The MRAM device 500 further includes a read circuit for sensing the resistance of selected memory cells 102 during read operations and a write circuit for orienting the magnetization of selected memory cells 102 during write operations. The read circuit is indicated generally at 520. The write circuit is not shown in order to simplify the explanation of an embodiment of the invention.

The read circuit 520 includes a plurality of steering circuits 522 and sense amplifiers 524. Multiple bit lines 106 are connected to each steering circuit 522. Each steering circuit 522 includes a set of switches that connect each bit line 106 to either a source of operating potential or to a sense amplifier 524. An output of the sense amplifier 524 is supplied to a data register 530, which, in turn, is coupled to an I/O pad 532 of the MRAM device 500. A plurality of bit lines may be multiplexed into each sense amplifier 524. If the MRAM device 500 has multiple levels of memory cell arrays, bit lines 106 from the additional levels may be multiplexed into the sense amplifiers 524.

In one embodiment, a current source, a voltage follower and a comparator (not shown) are used to determine the resistance state of a selected memory cell 102. In this embodiment, the row decode circuit 508 selects a word line crossing a selected memory cell 102 by connecting the corresponding word line 104 to the ground potential. The current source supplies a sense current to a bit line 106 crossing the selected memory cell 102. A potential at a junction between the current source and the selected memory cell 102 is detected by the voltage follower, which applies the same potential to a subset of unselected bit lines or word lines. The potential at the junction is also compared to a reference voltage by the comparator. An output of the comparator provides a high or low signal that indicates the resistance state of the selected memory cell 102.

In another embodiment, a current sense amplifier (not shown) and a voltage source are used to determine the resistance state of a selected memory cell 102. The row decode circuit 508 applies a sense voltage Vs to the selected word line 104, and the selected bit line 106 is coupled to a virtual ground of the current sense amplifier. The sense voltage Vs may be, for example, a de voltage between 0.1 volts and 0.5 volts and may be provided by an external source. A subset of unselected lines (e.g., all unselected bit lines) is also connected to the virtual ground. The virtual ground may be a zero potential or any other potential, so long as an equal potential is applied to the selected bit line 106 and the subset of unselected lines. A sense current flows from the voltage source, through the selected memory cell 102, and through the current sense amplifier. The sense current flowing through the selected bit line may be sensed to determine the resistance state and, therefore, logic value of the selected memory cell 102. The sense current is equal to either Vs/R or Vs/(R+$\Delta$R), depending upon the resistance state of the selected memory cell 102.

Figure 6:
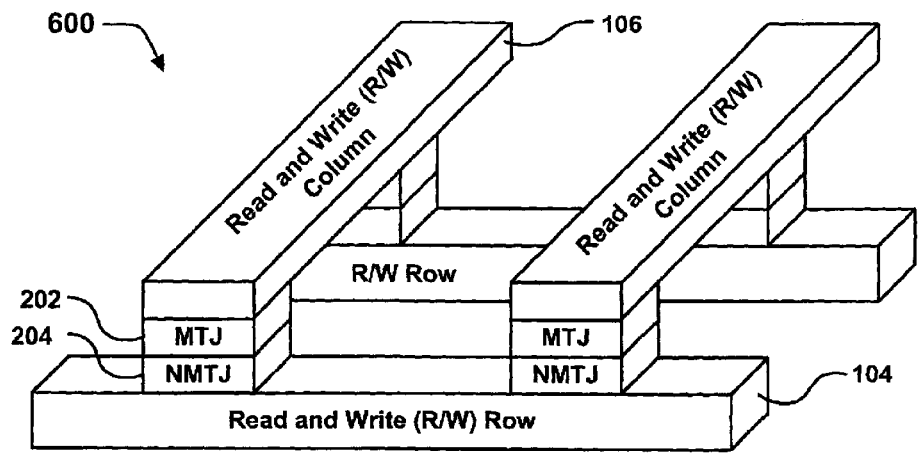
FIG. 6 depicts a perspective view of a memory array in accordance with one embodiment.
Figure 7:
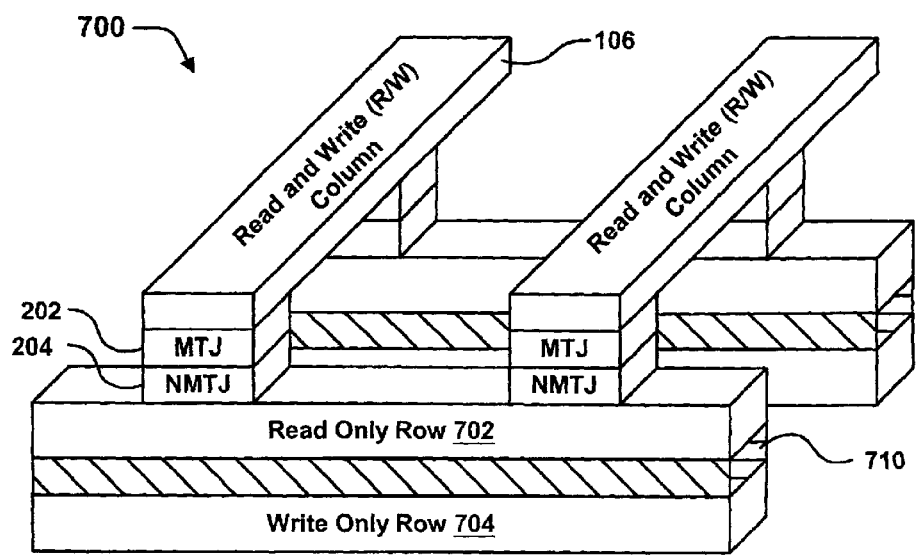
FIG. 7 depicts a perspective view of a memory array in accordance with another embodiment.
Figure 8:
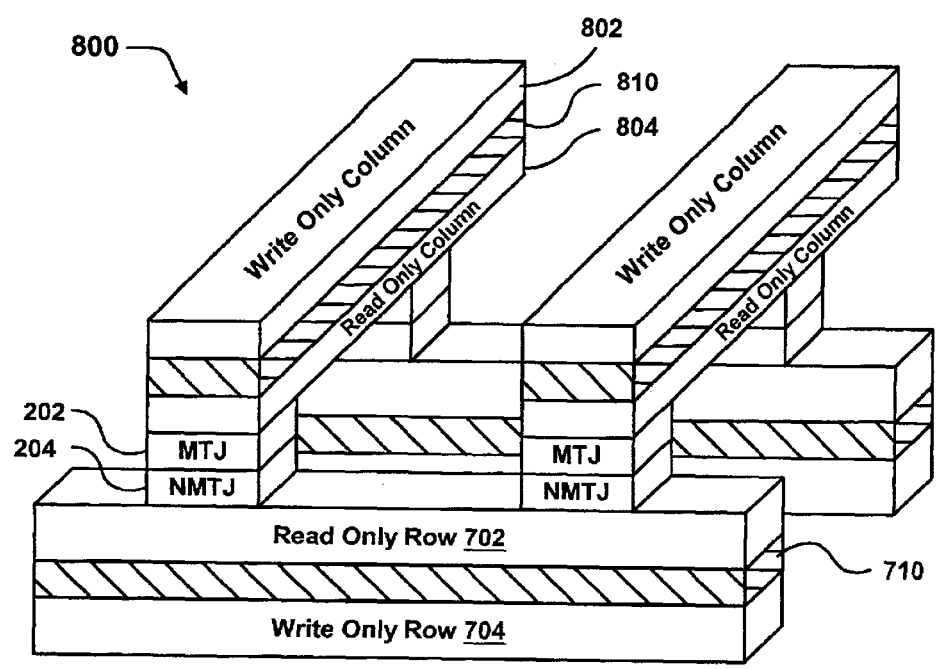
FIG. 8 depicts a perspective view of a memory array in accordance with yet another embodiment.

FIGS. 6, 7, and 8 depict examples of how memory arrays may be implemented. FIG. 6 depicts a perspective view of a first example memory array 600. The memory array 600 includes bit lines 106 and word lines 104, each functioning as a read and write (R/W) line. Only two word lines 104 and two bit lines 106 are shown to simplify the description of the array 600. In practice, a memory array 600 may have millions or even billions of word lines 104 and bit lines 106. A magnetic tunnel junction (MTJ) 202 and a non-magnetic tunnel junction (NMTJ) 204 are located at a cross point of a word line 104 and a bit line 106. The MTJ 202 is used to store a bit value, whereas the NMTJ 204 provides high resistance at low voltages in order to prevent any significant parasitic currents from flowing through the MTJ 202.

FIG. 7 depicts a perspective view of a second example memory array 700. The memory array 700 is similar to memory array 600 (FIG. 6) except that memory array 700 includes a first level of rows 702 for reading values stored via magnetic tunnel junctions 202 and a second level of rows 704 for writing values to the magnetic tunnel junctions 202. Each first level row 702 is separated by an insulating layer 710 from a second level row 704. This insulating layer 710 may comprise an insulating material such as, for example, silicon oxide.

FIG. 8 depicts a perspective view of a third example memory array 800. The memory array 800 is similar to memory array 700 (FIG. 7) except that memory array 800 includes a first level of columns 802 for reading values stored via magnetic tunnel junctions 202 and a second level of columns 804 for writing values to magnetic tunnel junctions 202. Each first level column 802 is separated by an insulating layer 810 from a second level column 804. This insulating layer 810 may have the same composition as the insulating layer 710 located between a first level row 702 and a second level row 704. Although not shown in FIGS. 6, 7, and 8, the NMTJ 204 may comprise a portion of the MTJ 202 and/or a portion of an underlying row, as shown, for example, in FIGS. 3B, 3C, and 3D.

It should be emphasized that the above-described embodiments of the invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and invention and protected by the following claims.

What is claimed is:

1. A magnetic random access memory (MRAM) cell comprising:
   a magnetic tunnel junction; and
   a non-magnetic tunnel junction (NMTJ) that is connected in series with the magnetic tunnel junction;
   wherein the NMTJ comprises:
      a first conductive layer;
      a second conductive layer; and
      an insulating layer that is located between the first conductive layer and the second conductive layer.

2. The MRAM cell of claim 1, wherein a resistance across the NMTJ has an inverse exponential relationship with a voltage across the NMTJ.

3. The MRAM cell of claim 1, wherein a relationship between a resistance of the NMTJ and a voltage across the NMTJ is independent of an orientation of magnetization of the first conductive layer or of the second conductive layer.

4. The MRAM cell of claim 1, wherein the second conductive layer comprises a portion of a bit line.

5. The MRAM cell of claim 1, wherein the second conductive layer comprises a portion of a word line.

6. The MRAM cell of claim 1, wherein the magnetic tunnel junction comprises:
   a first magnetic layer;
   a second magnetic layer; and
   an insulating layer that is located between the first magnetic layer and the second magnetic layer.

7. The MRAM cell of claim 6, wherein the second magnetic layer of the magnetic tunnel junction is the first conductive layer of the NMTJ.

8. A magnetic random access memory (MRAM) device comprising:
   a first wire for carrying a current for reading a bit value stored in an MRAM cell;
   a second wire for carrying a current for reading a bit value stored in the MRAM cell;
   a first magnetic layer located between the first wire and the second wire;
   a second magnetic layer located between the first wire and the second wire;
   a first insulating layer that is located between the first magnetic layer and the second magnetic layer; and
   a second insulating layer that is located between the second magnetic layer and the second wire.

9. The MRAM device of claim 8, wherein a resistance across the second insulating layer has a negative exponential relationship with a voltage across the second insulating layer.

10. The MRAM device of claim 8, wherein the second insulating layer comprises aluminum oxide.

11. The MRAM device of claim 8, wherein the first magnetic layer, the second magnetic layer, and the first insulating layer provide a magnetic tunnel junction.

12. The MRAM device of claim 8, wherein the second insulating layer is part of a non-magnetic tunnel junction (NMTJ).

13. The MRAM device of claim 12, wherein the NMTJ comprises the second magnetic layer.

14. The MRAM device of claim 12, wherein the NMTJ comprises a portion of the second wire.

15. A magnetic random access memory (MRAM) device comprising:
   a plurality of memory cells, each memory cell comprising a magnetic tunnel junction and a non-magnetic tunnel junction (NMTJ);
   a first plurality of wires, each of the first plurality of wires is connected to a subset of the plurality of memory cells;
   a second plurality of wires, each of the second plurality of wires is connected to a subset of the plurality of memory cells; and
   a steering circuit that is connected to at least one of the second plurality of wires.

16. The MRAM device of claim 15, further comprising:
   a row decode circuit that is connected to at least one of the first plurality of wires.

17. The MRAM device of claim 15, wherein a resistance across the NMTJ has an inverse exponential relationship with a voltage across the NMTJ.

18. The MRAM device of claim 15, wherein the magnetic tunnel junction comprises:
   a first magnetic layer; and
   a second magnetic layer.

19. The MRAM device of claim 18, wherein the magnetic tunnel junction further comprises:
   an insulating layer that is located between the first magnetic layer and the second magnetic layer.

20. The MRAM device of claim 15, wherein the NMTJ comprises:
   a first conductive layer; and
   a second conductive layer.

21. The MRAM device of claim 20, wherein the NMTJ further comprises:
   an insulating layer that is located between the first conductive layer and the second conductive layer.

22. A method for reading a value stored in a magnetic random access memory (MRAM) cell, comprising:
   providing a voltage differential across a magnetic tunnel junction of the memory cell; and
   providing a voltage differential across a non-magnetic tunnel junction (NMTJ) of the memory cell.

23. The method of claim 22, further comprising:
   measuring a current that flows through the magnetic tunnel junction and the NMTJ.

24. The method of claim 23, further comprising:
   determining the value that is stored in the MRAM cell based on a measurement for the current.

25. An array of memory cells comprising:
   a plurality of memory cells, each memory cell being connected to a subset of the plurality of memory cells via a conductive line, and having a magnetic tunnel junction and a non-magnetic tunnel junction (NMTJ);
   wherein the NMTJ comprises:
      a first conductive layer;
      a second conductive layer; and
      an insulating layer that is located between the first conductive layer and the second conductive layer.

26. The array of claim 25, wherein a resistance across the NMTJ has an inverse exponential relationship with a voltage across the NMTJ.

27. The array of claim 25, wherein the second conductive layer is not magnetized.

28. The array of claim 25, wherein the second conductive layer comprises a portion of the conductive line.

29. The array of claim 25, wherein the magnetic tunnel junction comprises:
   a first magnetic layer;
   a second magnetic layer; and
   an insulating layer that is located between the first magnetic layer and the second magnetic layer.

30. A magnetic random access memory (MRAM) cell comprising:

a first insulating layer that provides a resistance having a magnitude that is responsive to an orientation of magnetization of a magnetized layer in the MRAM cell; and a second insulating layer that provides a resistance having a magnitude that is not responsive to an orientation of magnetization of a magnetized layer in the MRAM cell, but that is responsive to a magnitude of a voltage drop across the second insulating layer.

31. The MRAM cell of claim 30, wherein the first insulating layer is part of a magnetic tunnel junction.

32. The MRAM cell of claim 30, wherein the second insulating layer is part of a non-magnetic tunnel junction.

* * * * *